(12) United States Patent
Hu et al.

(10) Patent No.: US 8,664,761 B1
(45) Date of Patent: Mar. 4, 2014

(54) SEMICONDUCTOR STRUCTURE AND MANUFACTURING METHOD OF THE SAME

(71) Applicant: Macronix International Co., Ltd., Hsinchu (TW)

(72) Inventors: Chih-Wei Hu, Miaoli County (TW); Teng-Hao Yeh, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 13/723,255

(22) Filed: Dec. 21, 2012

(51) Int. Cl.
*H01L 23/48* (2006.01)

(52) U.S. Cl.
USPC ........... 257/737; 257/754; 257/774; 257/698; 257/E23.011; 257/E23.145; 438/613; 438/667

(58) Field of Classification Search
USPC ................ 257/737, 754, 774, 698, E23.011, 257/E23.145; 438/613, 667
See application file for complete search history.

(56) References Cited

U.S. PATENT DOCUMENTS 8,338,961 B2 * 12/2012 Su et al. .................... 257/774

* cited by examiner

*Primary Examiner* — Tu-Tu Ho
(74) *Attorney, Agent, or Firm* — McClure, Qualey & Rodack, LLP

(57) ABSTRACT

A semiconductor structure and a manufacturing method of the same are provided. The semiconductor structure includes a plurality of stacked structures and a plurality of contact structures. Each of the stacked structures includes a plurality of conductive strips and a plurality of insulating strips, and the conductive strips and the insulating strips are interlaced. Each of the contact structures is electrically connected to each of the stacked structures. The contact structure includes a first conductive pillar, a dielectric material layer, a metal silicide layer, and a second conductive pillar. The dielectric material layer surrounds the lateral surface of the first conductive pillar. The metal silicide layer is formed on an upper surface of the first conductive pillar. The second conductive pillar is formed on the metal silicide layer. The upper surfaces of the first conductive pillars are coplanar.

20 Claims, 27 Drawing Sheets

SEMICONDUCTOR STRUCTURE AND MANUFACTURING METHOD OF THE SAME

BACKGROUND OF THE INVENTION

1. Field of the Invention

The disclosure relates in general to a semiconductor structure and a manufacturing method of the same, and more particularly to a semiconductor structure and a manufacturing method of the same for a 3D (three-dimensional) memory device.

2. Description of the Related Art

In recent years, the structures of semiconductor devices have been changed constantly, and the storage capacity of the devices has been increased continuously. Memory devices are used in storage elements for many products such as MP3 players, digital cameras, computer files, etc. As the application increases, the demand for memory devices focuses on small sizes and large memory capacities.

Designers have developed a method for improving a memory device density, using 3D stacked memory device so as to increase a memory capacity and a cost per cell. However, when such memory device is manufactured, the contact plugs for each bit line in different layers in the stacked structure need to be formed separately. Moreover, the contact plugs for different components, such as string select lines, ground select lines, and source contacts, need to be formed separately as well. As such, a process for manufacturing this kind of the memory device, having a complicated structure, is complicated.

SUMMARY OF THE INVENTION

The invention is directed to a semiconductor structure and a manufacturing method of the same, which can be used in memory devices. According to the embodiments of the disclosure, a plurality of contact structures of the semiconductor are formed by a two-step process, such that the contact structures with different heights can be formed in one manufacturing process, and hence, the manufacturing process is simplified, and the processing time and cost is reduced.

According to one embodiment of the present disclosure, a semiconductor structure is provided. The semiconductor structure includes a plurality of stacked structures and a plurality of contact structures. Each of the stacked structures includes a plurality of conductive strips and a plurality of insulating strips, and the conductive strips and the insulating strips are interlaced. Each of the contact structures is electrically connected to each of the stacked structures. The contact structure includes a first conductive pillar, a dielectric material layer, a metal silicide layer, and a second conductive pillar.

The dielectric material layer surrounds the lateral surface of the first conductive pillar. The metal silicide layer is formed on an upper surface of the first conductive pillar. The second conductive pillar is formed on the metal silicide layer. The upper surfaces of the first conductive pillars are coplanar.

According to another embodiment of the present disclosure, a method of manufacturing a semiconductor structure is provided. The method comprises the following steps. A plurality of stacked structures are formed, wherein a plurality of conductive strips and a plurality of insulating strips are formed, and the conductive strips and the insulating strips are interlaced. A plurality of contact structures are formed, wherein each of the contact structures is electrically connected to each of the stacked structures. The method of forming each of the contact structure comprises the following steps. A first conductive pillar is formed. A dielectric layer is formed, surrounding the lateral surface of the first conductive pillar. A metal silicide layer is formed on an upper surface of the first conductive pillar. A second conductive pillar is formed on the metal silicide layer, wherein the heights of the second conductive pillar are the same.

According to a further embodiment of the present disclosure, a method of manufacturing a semiconductor structure is provided. The method comprises the following steps. A plurality of stacked structures are formed, wherein a plurality of conductive strips and a plurality of insulating strips are formed, and the conductive strips and the insulating strips are interlaced. An insulating material layer is formed, covering the stacked structures. A plurality of holes are formed in the insulating material layer, wherein a portion of each of the stacked structures is exposed from the holes. A plurality of dielectric material layers are formed on the sidewalls of the holes, respectively. A conductive material is filled in the holes for forming a plurality of first conductive pillars. A plurality of metal silicide layers are formed on upper surfaces of the first conductive pillars. A plurality of second conductive pillars are formed on the metal silicide layers, wherein the heights of the second conductive pillars are the same.

The disclosure will become apparent from the following detailed description of the preferred but non-limiting embodiments. The following description is made with reference to the accompanying drawings.

DETAILED DESCRIPTION OF THE INVENTION

In the embodiment of the present disclosure, a semiconductor structure and a manufacturing method of the same are provided. According to the embodiments of the disclosure, a plurality of contact structures of the semiconductor are formed by a two-step process, such that the contact structures with different heights can be formed in one manufacturing process, and hence, the manufacturing process is simplified, and the processing time and cost is reduced. However, the descriptions disclosed in the embodiments of the disclosure such as detailed structures, manufacturing procedures, operating procedures, and material selections are for illustration only, not for limiting the scope of protection of the disclosure.

Figure 1:
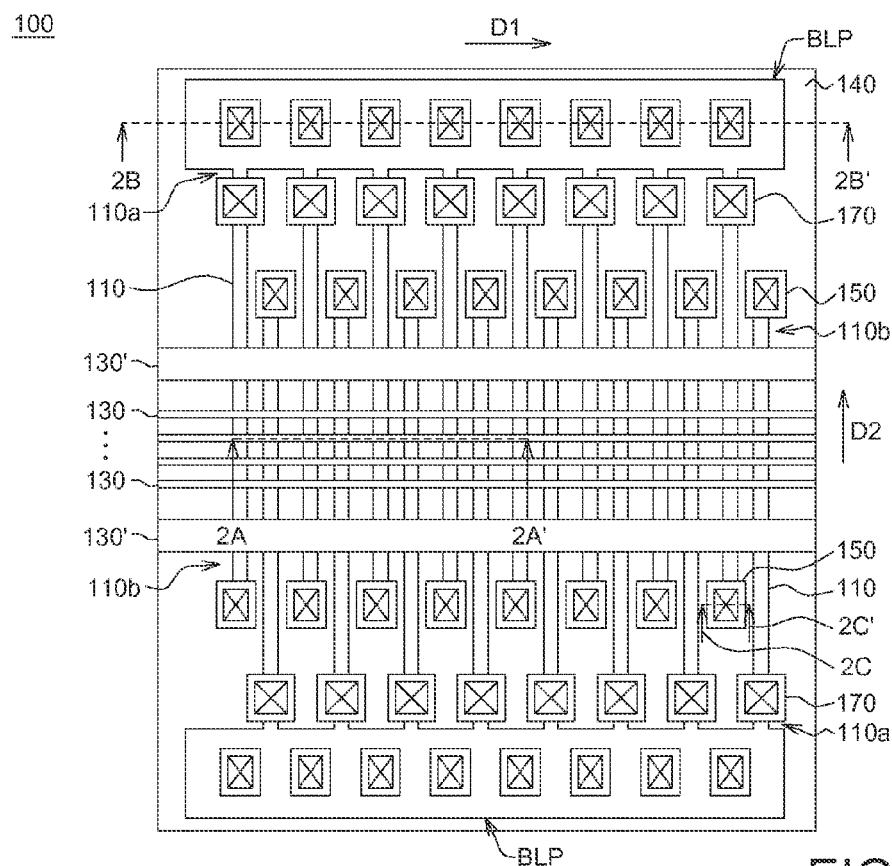
FIG. 1 shows a top view of a semiconductor structure according to an embodiment of the present disclosure.
Figure 2A:
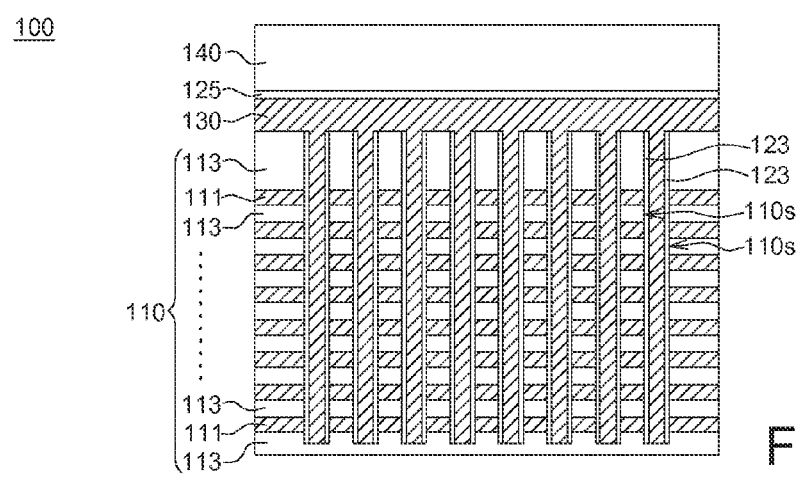
FIG. 2A shows a cross-sectional view along the section line 2A-2A' in FIG. 1.
Figure 2B:
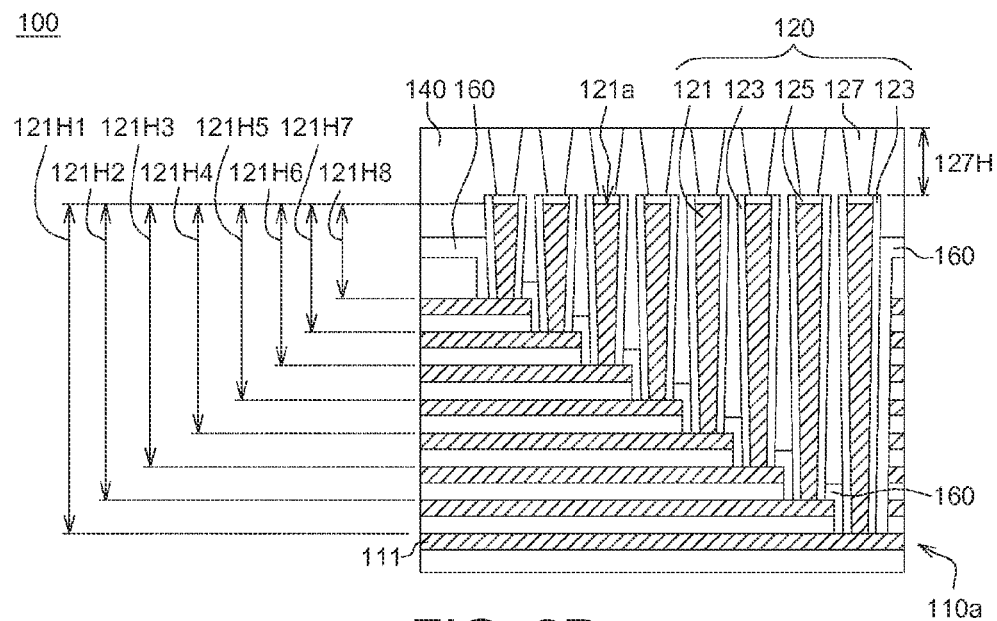
FIG. 2B shows a cross-sectional view along the section line 2B-2B' in FIG. 1.
Figure 2C:
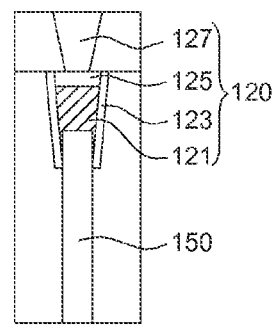
FIG. 2C shows a cross-sectional view along the section line 2C-2C' in FIG. 1.

FIG. 1 shows a top view of a semiconductor structure according to an embodiment of the present disclosure. FIG. 2A shows a cross-sectional view along the section line 2A-2A' in FIG. 1. FIG. 2B shows a cross-sectional view along the section line 2B-2B' in FIG. 1. FIG. 2C shows a cross-sectional view along the section line 2C-2C' in FIG. 1.

Please refer to FIGS. 1 and 2A-2B. The semiconductor 100 includes a plurality of stacked structures 110 and a plurality of contact structures 120. Each of the stacked structures includes a plurality of conductive strips 111 and a plurality of insulating strips 113. and the conductive strips 111 and the insulating strips 113 are interlaced. Each of the contact structures 120 is electrically connected to a first end 110a of each of the stacked structures 110. Each of the contact structures 120 includes a first conductive pillar 121, a dielectric material layer 123, a metal silicide layer 125, and a second conductive pillar 127. The dielectric material layer 123 surrounds the lateral surface of the first conductive pillar 121. The metal silicide layer 125 is formed on an upper surface 121a of the first conductive pillar 121. The second conductive pillar 127 is formed on the metal silicide layer 125. The upper surfaces 121a of the first conductive pillars 121 of the contact structures 120 are coplanar. In the embodiment, the materials of the conductive strips comprise a silicon-containing material, such as polysilicon, the materials of the insulating strips 113 comprise oxides, such as silicon oxide. However, the material selections are depending on the conditions applied and are not limited to the materials aforementioned.

In the embodiment, as shown in FIG. 2B, in the contact area BLP, the heights 127H of the second conductive pillars 127 are, for example, the same, and the heights 121H1-121H8 of the first conductive pillars 121 are, for example, different. For example, the height 121H1 of the first conductive pillar 121 is different from the other heights 121H2-121H8 of the first conductive pillars 121. As such, as shown in FIG. 2B, the contact structures 121 in the contact area BLP form a step-like structure.

In the embodiment, the material of the first conductive pillars 121 is such as different from the material of the second conductive pillars 127. The material of the first conductive pillars 121 is such as polysilicon, and the material of the second conductive pillars 127 is such as tungsten. The material of the metal silicide layer 125 is such as nickel silicide or cobalt silicide, capable of reducing the resistance of the first conductive pillars 121. However, the material selections are depending on the conditions applied and are not limited to the materials aforementioned.

In the embodiment, as shown in FIG. 2A, the dielectric material layer 123 is also formed on the two sidewalls 110s of the stacked structures 110. The dielectric material layer 123 may comprise charge trapping materials. For example, the dielectric material layer 123 may have a multi-layer structure, for example, which may be ONO composite layers, ONONO composite layers, or BE-SONOS composite layers, or comprise, for example, an ONO structure formed by alternately stacking silicon oxide and silicon nitride.

In the embodiment, as shown in FIGS. 2A-2B, each of the first conductive pillars 121 of the contact structures 120 is electrically connected to one of the conductive strips 111 of each of the stacked structures 110.

In an embodiment, as shown in FIGS. 1 and 2A, the semiconductor structure 100 can further comprises a plurality of striped conductive structures 130 and 130'. The striped conductive structures 130 and 130' are formed on and between the stacked structures 110, and the striped conductive structures 130 and 130' are extended in a direction D1 perpendicular to a direction D2 which the stacked structures 110 are extended in.

In an embodiment, the semiconductor structure 100 can further comprise an insulating structure 140. As shown in FIG. 1, the insulating structure 140 is formed between the striped conductive structures 130 and 130'. As shown in FIG. 2B, the insulating structure 140 is also formed between the contact structures 120, and the contact structures 120 are separated from one another by the insulating structure 140. In the embodiment, the material of the insulating structure 140 comprises, for example, oxides.

In an embodiment, as shown in FIG. 2C, the semiconductor structure 100 can further comprise a plurality of conductive blocks 150, and the conductive blocks 150 are electrically connected to the stacked structures 110. In the embodiment, each of the conductive blocks 150 is formed on a second end 110b opposite to the first end 110a of each of the stacked structures 110. As shown in FIG. 2C, the contact structures 120 can further be formed on the conductive blocks 150.

In an embodiment, as shown in FIG. 2B, the semiconductor structure 100 can further comprises a barrier layer 160. The barrier layer 160 is disposed, for example, between the contact structures 120. In the embodiment, the material of the barrier layer 170 comprises, for example, metal nitrides. However, the material selections are depending on the conditions applied and are not limited to the materials aforementioned.

In an embodiment, as shown in FIG. 1, the semiconductor structure 100 can further comprises a plurality of conductive blocks 170, and the conductive blocks 170 are electrically connected to the stacked structures 110. In the embodiment, each of the conductive blocks 170 is electrically connected to a corresponding contact structure 120.

In an embodiment, the semiconductor structure 100 is such as a 3D (three-dimensional) memory device, as shown in FIGS. 1-2C, the stacked structures 110 are such as bit lines (BL), the contact structures 120 located on the contact area BLP are such as a bit line pad (BLP), the striped conductive structures 130 are such as word lines (WL), the striped conductive structures 130' are such as ground select lines (GSL), the conductive blocks 150 are such as source contacts (SC), and the conductive blocks 170 are such as string select lines (SSL). The conductive blocks 170 (SSL) may access conductive strips 111 in different layers of the stacked structure through the step-like contact structures 120 in the contact area BLP.

Conventionally, the manufacturing method of a 3D memory device comprises about the following steps. The step-like structure on an end of the stacked structures 110 is formed, the oxide layer on the step-like structure is etched to form a plurality of contact holes, and then tungsten metal is filled in the holes to form a plurality of tungsten plugs with different heights. However, different tungsten plugs connected to different conductive strips 111 have different heights, therefore, the etching depths for forming different tungsten plugs have to be different. As such, the manufacturing steps are increased, as well as the manufacturing time and cost. Moreover, the memory device comprise other contacts requiring the formation of contact plugs, such as source contact and string select lines. Based on the similar reasons as described above, it would be almost impossible to form all the contact plugs the memory device requires in one manufacturing process by the conventional manufacturing method. In contrast, according to the embodiments of the present disclosure, the upper surfaces 121a of the first conductive pillars 121 of the contact structures 120 are coplanar, therefore, a plurality of second conductive pillars 127 (contact plugs, such as tungsten plugs) can be formed in one manufacturing step. As such, the manufacturing steps, time, and cost are effectively decreased.

The embodiments disclosed below are for elaborating a manufacturing method of the semiconductor structures of the disclosure. However, the descriptions disclosed in the embodiments of the disclosure such as detailed manufacturing procedures are for illustration only, not for limiting the scope of protection of the disclosure. Referring to FIGS. 3-23C, FIGS. 3-23C illustrate a process for manufacturing a semiconductor structure according to one embodiment of the present disclosure. Also, it is also important to point out that the illustrations may not be necessarily be drawn to scale, and that there may be other embodiments of the present disclosure which are not specifically illustrated. Thus, the specification and the drawings are to be regard as an illustrative sense rather than a restrictive sense.

First, referring to FIGS. 3-7C, a plurality of stacked structures 110 are formed, wherein a plurality of conductive strips 111 and a plurality of insulating are formed and interlaced. Moreover, a contact area BLP having a step-like structure is formed on an end of the stacked structures 110. Moreover, a plurality of conductive blocks 150 are formed on another end, opposite to the end where the contact area BLP is located, of the stacked structures 110, and the conductive blocks 150 are electrically connected to the stacked structures 110.

The manufacturing method of forming the stacked structures 110, the contact area BLP, and the conductive blocks 150 comprises, for example, the following steps.

Figure 3:
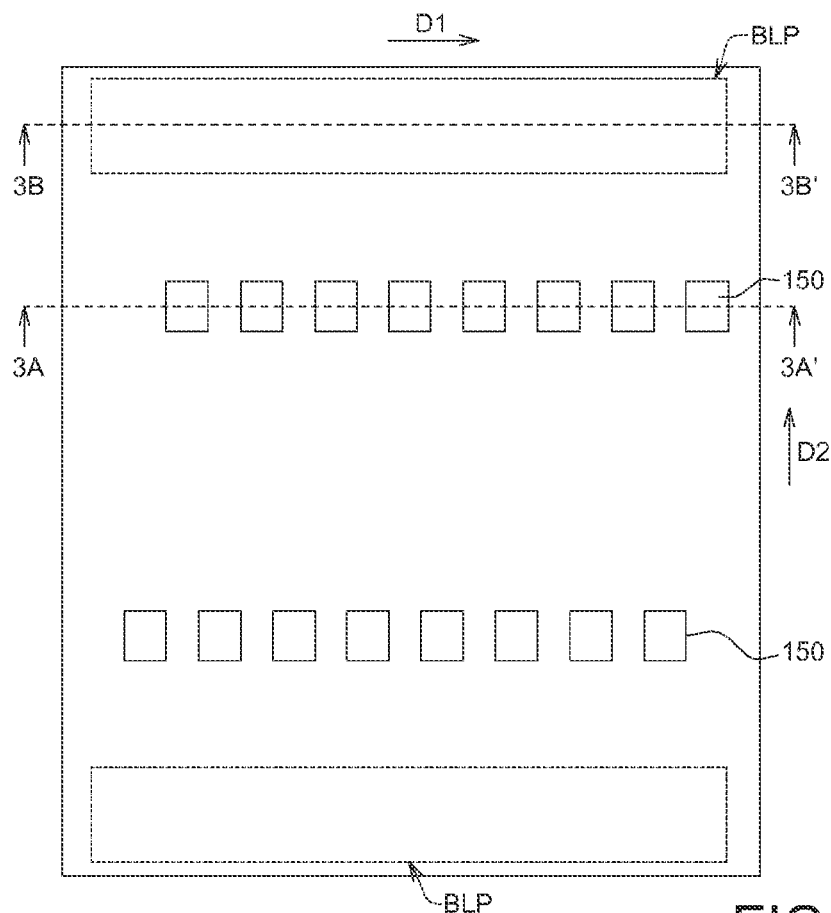
FIGS. 3-23C illustrate a process for manufacturing a semiconductor structure according to one embodiment of the present disclosure.
Figure 4A:
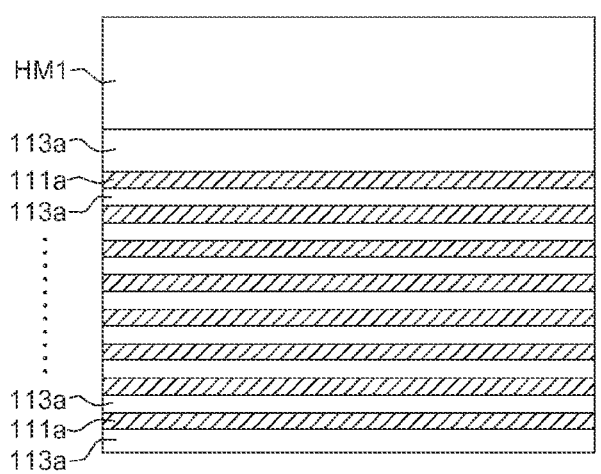
Figure 4B:
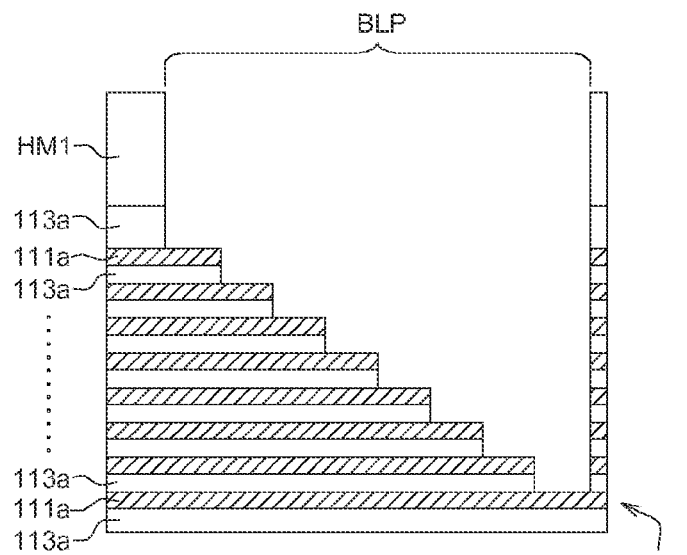

As shown in FIGS. 3 and 4A-4B (FIG. 4A shows a cross-sectional view along the section line 3A-3A' in FIG. 3, FIG. 4B shows a cross-sectional view along the section line 3B-3B' in FIG. 3), a plurality of conductive layers 111a and a plurality of insulating layers 113a are formed, and the conductive layers 111a and the insulating layers 113a are interlaced. Further, a plurality of conductive blocks 150 are formed in the composite film formed of the interlaced conductive layers 111 and insulating layers 113a. Next, part of the conductive layers 111 and insulating layers 113a in the predetermined contact area BLP is removed to form the step-like structure as shown in FIG. 4B. The part of the conductive layers 111 and insulating layers 113a is removed by such as a mask etching process with a hard mask HM1.

Figure 5A:
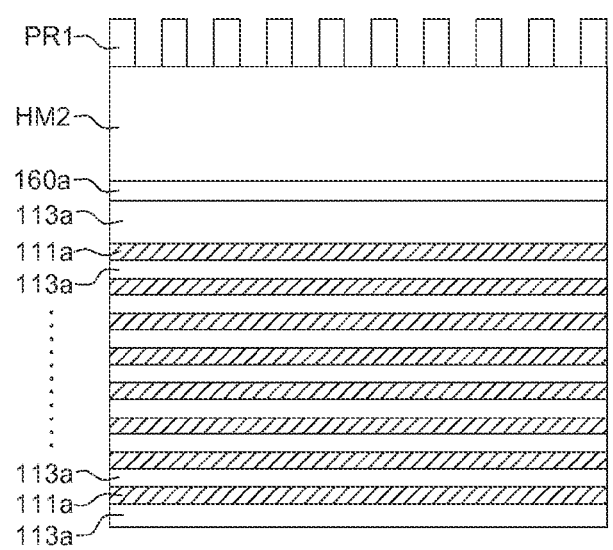
Figure 5B:
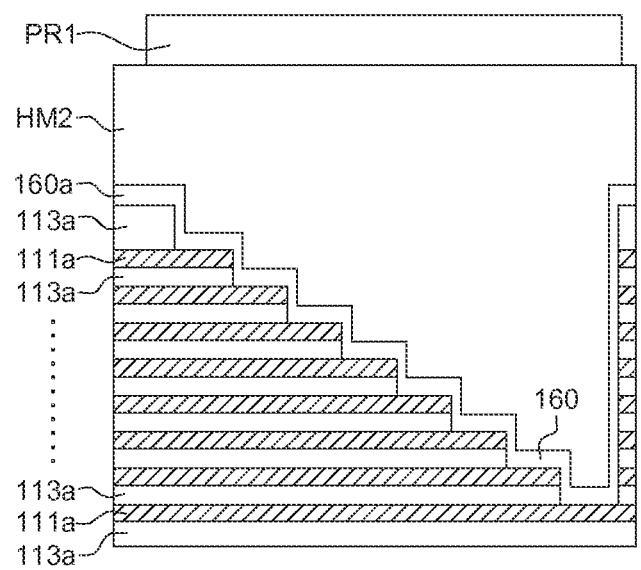

As shown in FIGS. 5A-5B (FIG. 5A shows a cross-sectional view along the section line 3A-3A' in FIG. 3, FIG. 5B shows a cross-sectional view along the section line 3B-3B' in FIG. 3), the hard mask HM1 is removed, and then a barrier material layer 160a is formed on the conductive layers 111a, the insulating layers 113a, and the conductive blocks 150. The barrier material layer 160a can be used as an etching stop layer in following manufacturing processes. Next, a hard mask HM2 is disposed on and covering the barrier material layer 160a, and then a patterned photoresist PR1 is disposed on the hard mask HM2.

Figure 6:
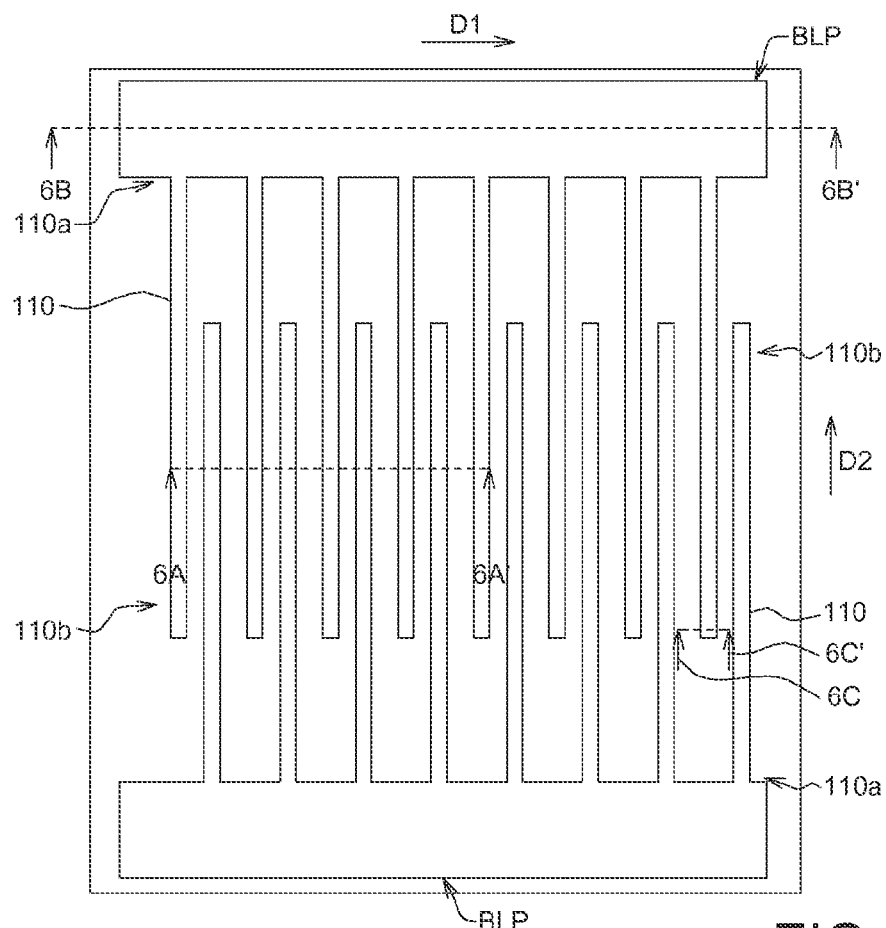
Figure 7A:
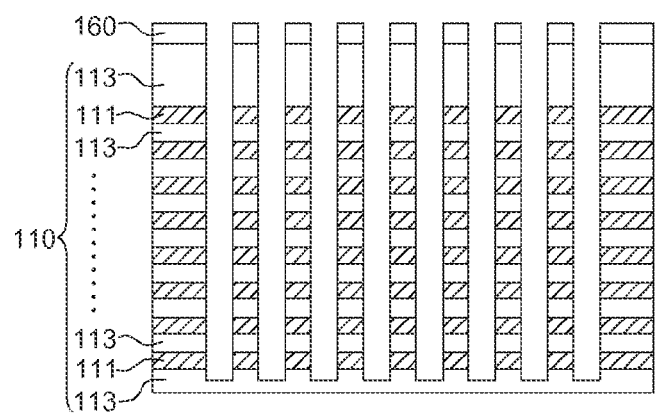
Figure 7B:
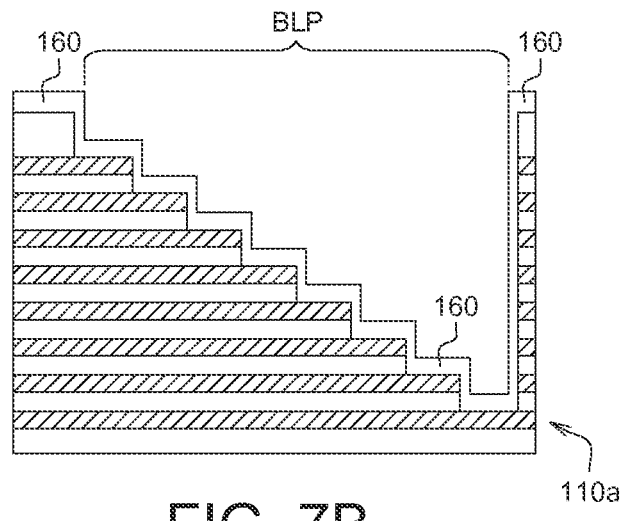
Figure 7C:
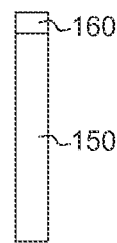

As shown in FIGS. 6-7C (FIG. 7A shows a cross-sectional view along the section line 6A-6A' in FIG. 6, FIG. 7B shows a cross-sectional view along the section line 6B-6B' in FIG. 6, FIG. 7C shows a cross-sectional view along the section line 6C-6C' in FIG. 6), the conductive layers 111a and the insulating layers 113a are etched according to the patterned photoresist PR1, by such as a mask etching process, to form the plurality of stacked structures 110. In addition, after the etching process, the barrier material layer 160a is also etched to form a barrier layer 160 on the stacked structures 110, the conductive blocks 150, and the contact area BLP.

Next, referring to FIGS. 8A-23C, a plurality of contact structures 120 are formed, and each of the contact structures 120 is electrically connected to each of the stacked structures 110. For example, each of the contact structures 120 is electrically connected to a first end 110a of each of the stacked structures 110. The contact structures 120 can also be formed on the conductive blocks 150 and 170. The manufacturing method of forming one contact structure 110 includes, for example, the following steps: forming a first conductive pillar 121; forming a dielectric material layer 123 surrounding the lateral surface of the first conductive pillar 121; forming a metal silicide layer 125 on an upper surface 121a of the first conductive pillar 121; and forming a second conductive pillar 127 on the metal silicide layer 125, wherein the heights 127H of the plurality of second conductive pillars 127 are the same.

The manufacturing method of forming the first conductive pillars 121 and the corresponding dielectric material layer 123 includes, for example, the following steps.

Figure 8A:
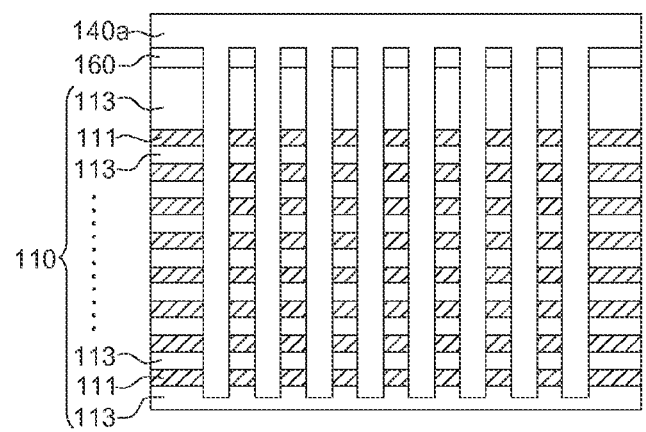
Figure 8B:
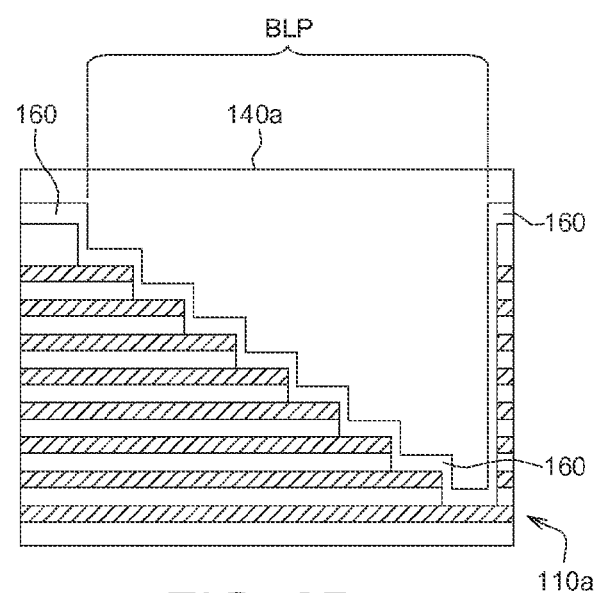
Figure 8C:
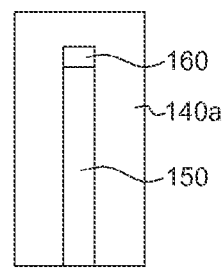

As shown in FIGS. 8A-8C (FIG. 8A shows a cross-sectional view along the section line 6A-6A' in FIG. 6, FIG. 8B shows a cross-sectional view along the section line 6B-6B' in FIG. 6, FIG. 8C shows a cross-sectional view along the section line 6C-6C' in FIG. 6), an insulating material layer 140a is formed on the surface of the whole structure. The insulating material layer 140a covers the stacked structures 110, the conductive blocks 150, and the contact area BLP. In the embodiment, the insulating material layer 140a is such as a metal oxide.

Figure 9:
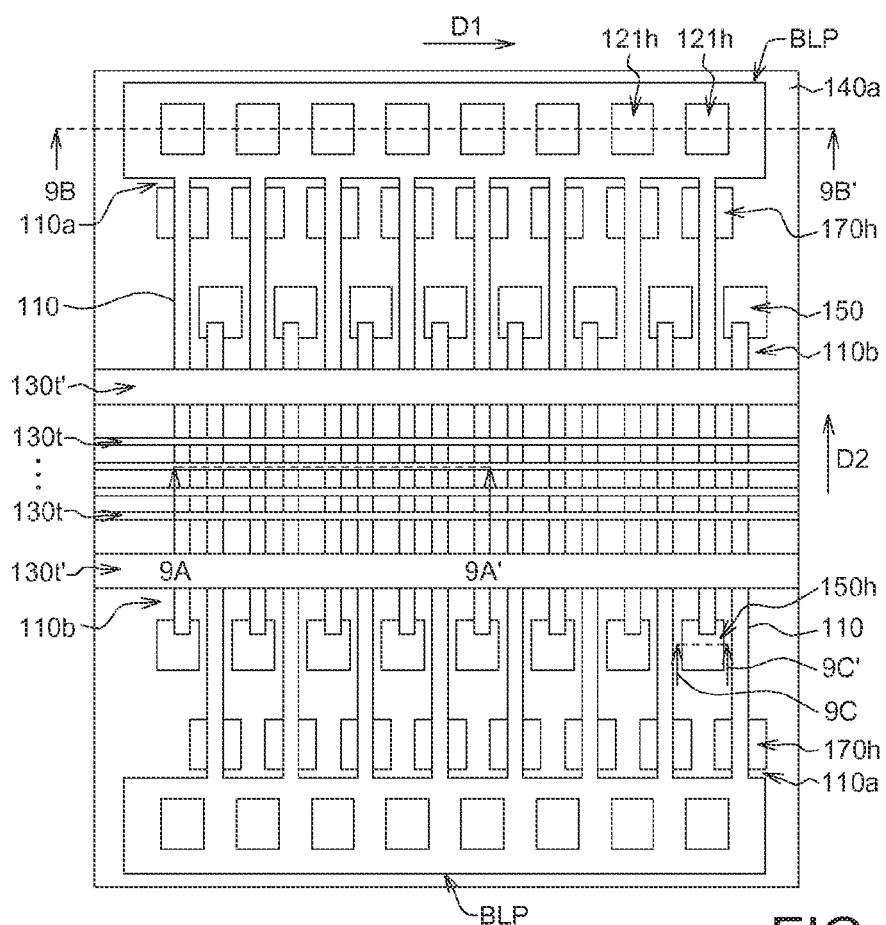
Figure 10A:
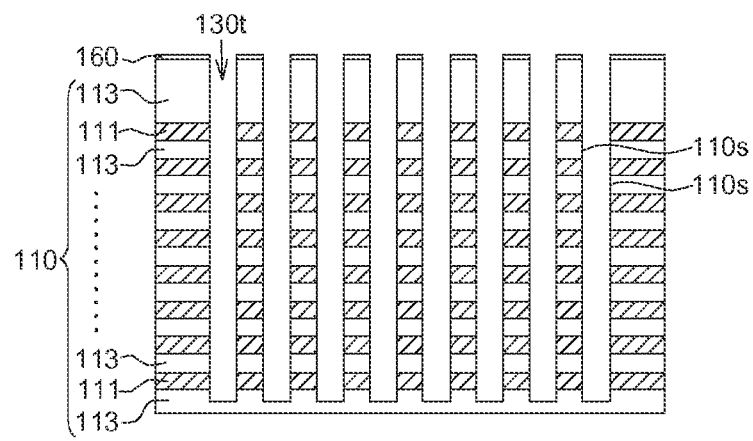
Figure 10B:
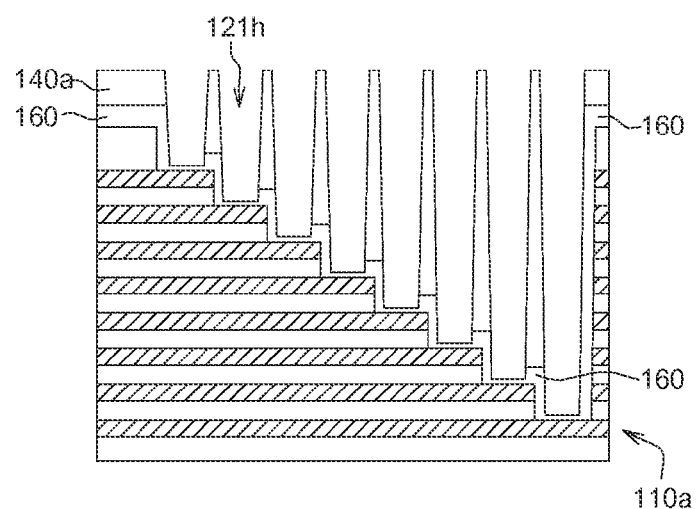
Figure 10C:
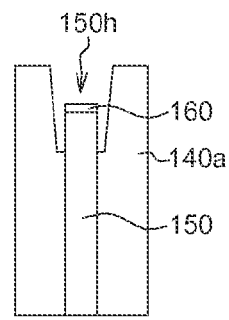

As shown in FIGS. 9-10C (FIG. 10A shows a cross-sectional view along the section line 9A-9A' in FIG. 9, FIG. 10B shows a cross-sectional view along the section line 9B-9B' in FIG. 9, FIG. 10C shows a cross-sectional view along the section line 9C-9C' in FIG. 9), a plurality of holes 121h are formed in the insulating material layer 140a, and the holes 121h are located on the end 110a of the stacked structures 110 connected to the contact area BLP. As shown in FIGS. 9-10C, a plurality of holes 150h and 170h and a plurality of trenches 130t and 130t' are also formed in the insulating material layer 140a. The trenches 130t and 130t' are extended in a direction D1 perpendicular to a direction D2 which the stacked structures 110 are extended in. In the embodiment, the trenches 130t and 103t' and the holes 121h, 150h, and 170h are formed simultaneously. In the embodiment, the holes and the trenches are formed by such as an etching process, and the barrier layer 160 can be the etching stop layer, such that the insulating material layer 140a between the stacked structures 110 is fully removed, and the stacked structures 110 are protected and not etched. In addition, the barrier layer 160 on the bottom of the holes 121h, 150h, and 170h is thinned and not fully removed, such that the conductive strips 111 below the holes 121h, 150h, and 170h are not etched and damaged, and the stacked structures 110 are clearly defined.

In an embodiment, the semiconductor structure 100 is such as a 3D memory device, and the holes and the trenches define the shapes, locations, and scopes of word lines, ground select lines, string select lines, source contacts, and bit line pad, which will be formed in the following processing steps. Therefore, in the embodiment of the disclosure, the locations of contact plugs of a plurality of components/devices can be defined in one manufacturing process, as such, the manufacturing process of the memory device is simplified, and the manufacturing time and cost are reduced.

Figure 11A:
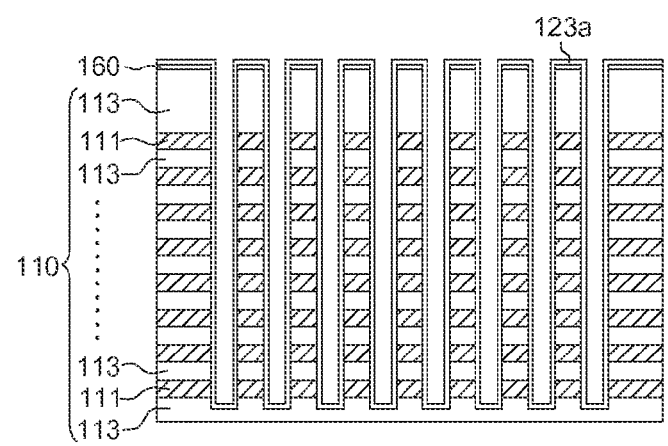
Figure 11B:
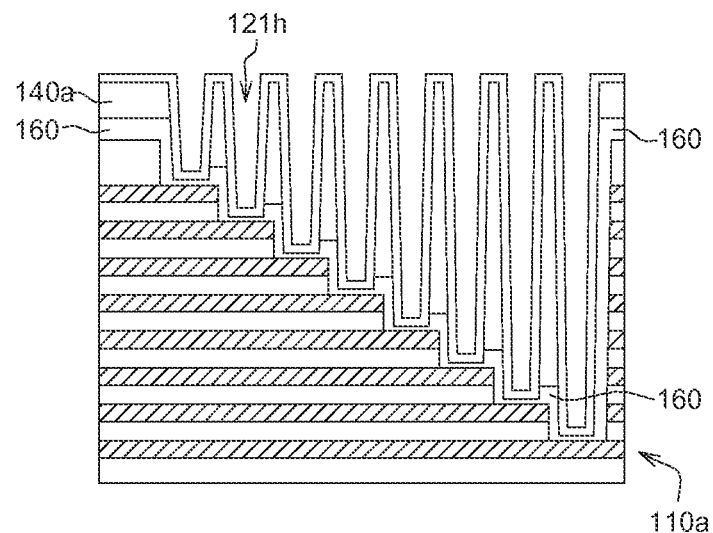
Figure 11C:
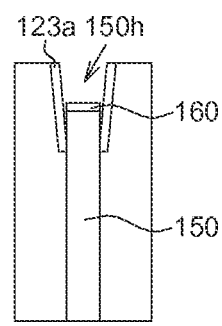

As shown in FIGS. 11A-11C (FIG. 11A shows a cross-sectional view along the section line 9A-9A' in FIG. 9, FIG. 11B shows a cross-sectional view along the section line 9B-9B' in FIG. 9, FIG. 11C shows a cross-sectional view along the section line 9C-9C' in FIG. 9), a dielectric material coating layer 123a is formed on the stacked structures 110 and in the holes 121h. In the embodiment, the dielectric material coating layer 123a fully covers the barrier layer 160, the stacked structures 110, the trenches 130t and 130t, and the holes 121h, 150h, and 170h.

Figure 12A:
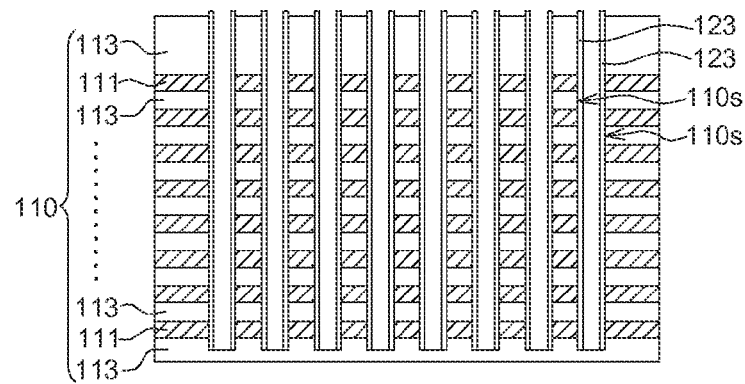
Figure 12B:
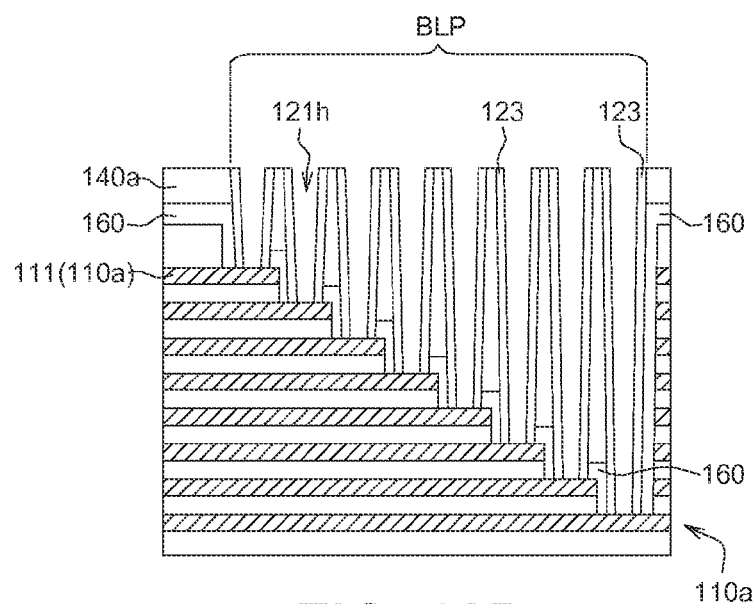
Figure 12C:
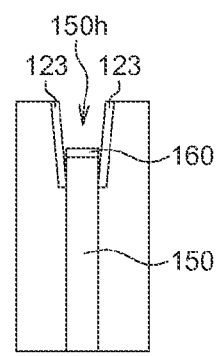

As shown in FIGS. 12A-12C (FIG. 12A shows a cross-sectional view along the section line 9A-9A' in FIG. 9, FIG. 12B shows a cross-sectional view along the section line 9B-9B' in FIG. 9, FIG. 12C shows a cross-sectional view along the section line 9C-9C' in FIG. 9), the dielectric material coating layer 123a and the barrier layer 160 are etched. A portion of each of the stacked structures 110 is exposed from the holes 121h. For example, the first end 110a of each of the stacked structures 110, such as the conductive strips 111 located in the contact area BLP, is exposed from the holes 121h. And then, the dielectric material layer 123 is formed on the sidewalls of the holes 121h. In the embodiment, the dielectric material layer 123 is also formed on the sidewalls of the holes 150h and 170h, the sidewalls of the trenches 130t and 130t', and between the stacked structures 110. In the embodiment, the whole structure is etched comprehensively by such as an anisotropic etching process.

Figure 13A:
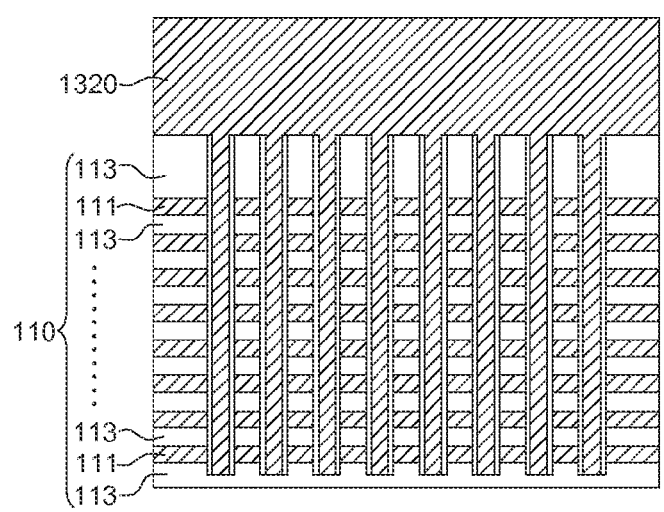
Figure 13B:
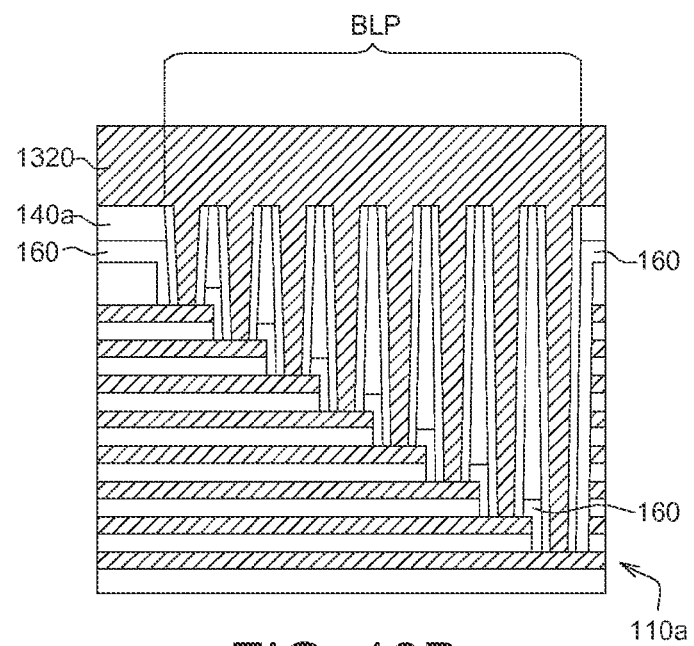
Figure 13C:
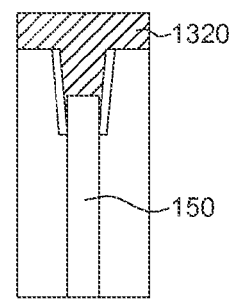

As shown in FIGS. 13A-13C (FIG. 13A shows a cross-sectional view along the section line 9A-9A' in FIG. 9, FIG. 13B shows a cross-sectional view along the section line 9B-9B' in FIG. 9, FIG. 13C shows a cross-sectional view along the section line 9C-9C' in FIG. 9), a conductive material is filled in the holes 121h and form a conductive material layer 1320. In the embodiment, the conductive material is also filled in the holes 150h and 170h, the trenches 130t and 130t', and between the stacked structures 110. In the embodiment, the conductive material is filled in the trenches 130t and 130t' and in the holes 121h, 150h, and 170h simultaneously. In the embodiment, the conductive material layer 1320 fully covers the stacked structures 110 and the contact area BLP. The conductive material layer 1320 is such as undoped polysilicon.

Figure 14:
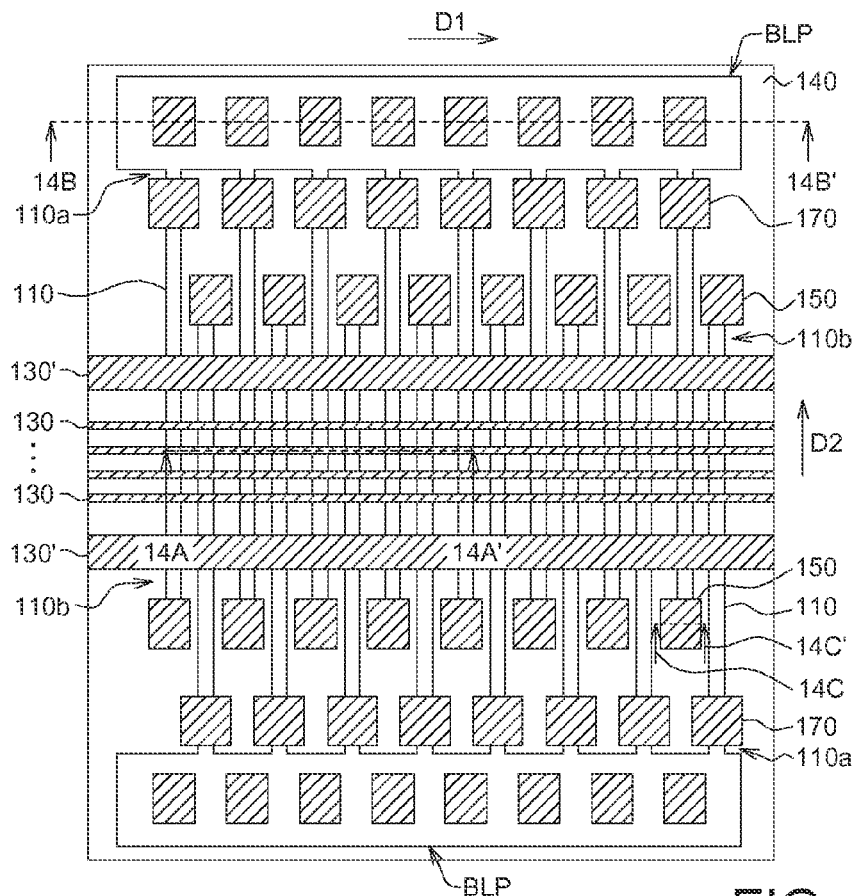
Figure 15A:
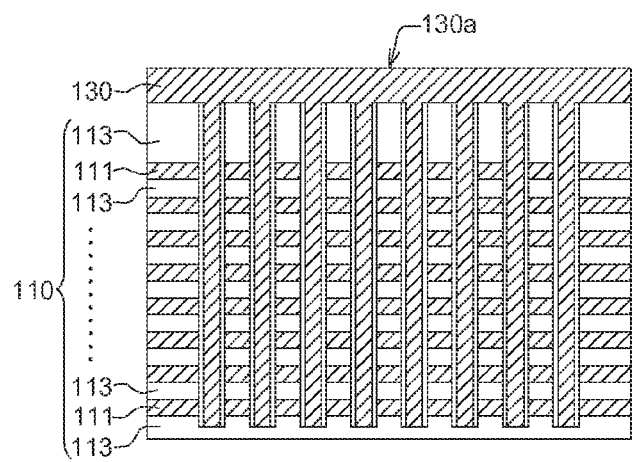
Figure 15B:
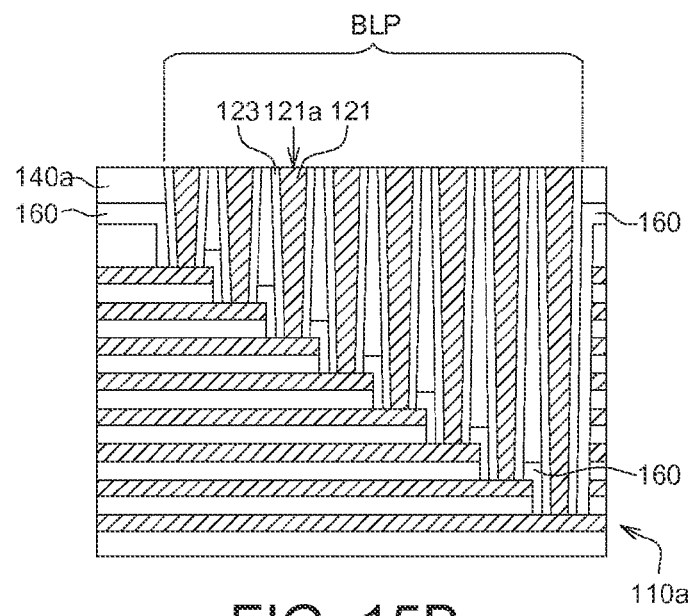
Figure 15C:
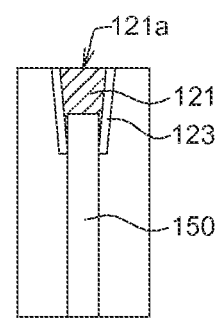

As shown in FIGS. 14-15C (FIG. 15A shows a cross-sectional view along the section line 14A-14A' in FIG. 14, FIG. 15B shows a cross-sectional view along the section line 14B-14B' in FIG. 14, FIG. 15C shows a cross-sectional view along the section line 14C-14C' in FIG. 14), part of the conductive material layer 1320 is removed to expose the upper surface 140a1 of the insulating material layer 140a. As such, the first conductive pillars 121 are formed. In the embodiment, the first conductive pillars 121 are such as formed on the step-like structure in the contact area BLP and on the conductive blocks 150. In the embodiment, the part of the conductive material layer 1320 is removed by such as a chemical mechanical polishing (CMP) process to form the first conductive pillars 121. In the embodiment, the upper surfaces 121a of the first conductive pillars 121 after the planarization by the CMP process are substantially coplanar with the upper surface 140a1 of the insulating material layer 140a.

In the embodiment, a plurality of striped conductive structures 130 and 130' are also formed when part of the conductive material layer 1320 is removed to expose the upper surface 140a1 of the insulating material layer 140a. The striped conductive structures 130 and 130' are extended in a direction D1 perpendicular to the direction D2 which the stacked structures 110 are extended in. In the embodiment, the striped conductive structures 130 and 130' and the first conductive pillars 121 are formed simultaneously. In the embodiment, a plurality of conductive blocks 170 are also formed in the holes 170h when part of the conductive material layer 1320 is removed to expose the upper surface 140a1 of the insulating material layer 140a.

In an embodiment, the semiconductor structure 100 is such as a 3D memory device, the striped conductive structures 130 are such as word lines, the striped conductive structures 130' located on two sides of the striped conductive structures 130 are such as ground select lines, the stacked structures 110 are such as bit lines (BL), the first conductive pillars 121 on the conductive blocks 150 are such as contact plugs for the source contacts, and the conductive blocks 170 are such as string select lines. The conductive blocks 170 are electrically connected to the contact structures 120 through the conductive strips 111. In the embodiment, the striped conductive structures 130 are formed in the trenches 130t which are separated from one another. Therefore, a good insulation between the striped conductive structures 130 is achieved. That is to say, each of the striped conductive structures 130 is formed independently in each of the trenches 130t, which are separated from one another, such that there would be no residual conductive materials between the striped conductive structures 130, thus, a good insulation between the striped conductive structures 130 is achieved, and the reliability of the device to be manufactured in the following process can be improved.

The manufacturing method of forming the metal silicide layer 125 includes such as the following steps, but not limited thereto. The metal silicide layer 125 can also be deposited directly on the selected regions.

Figure 16A:
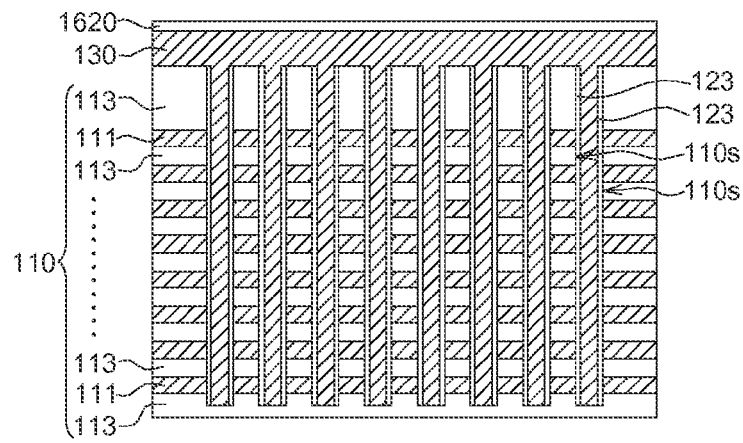
Figure 16B:
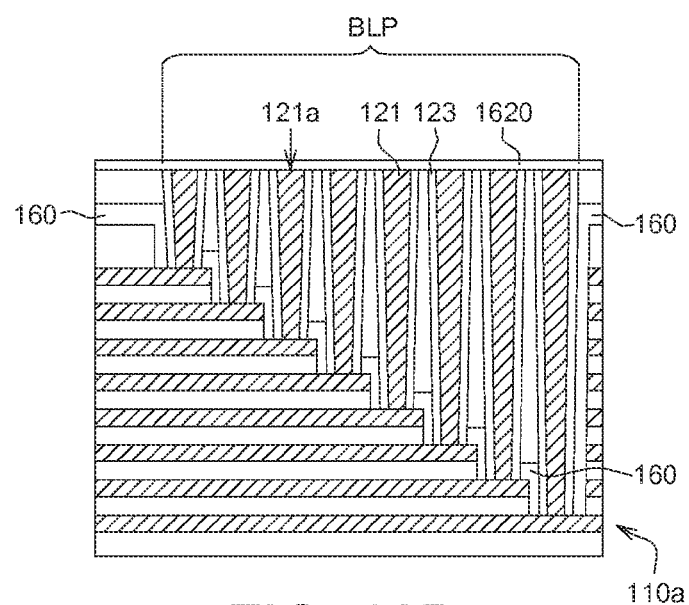
Figure 16C:
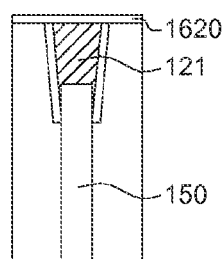

As shown in FIGS. 16A-16C (FIG. 16A shows a cross-sectional view along the section line 14A-14A' in FIG. 14, FIG. 16B shows a cross-sectional view along the section line 14B-14B' in FIG. 14, FIG. 16C shows a cross-sectional view along the section line 14C-14C' in FIG. 14), a metal layer 1620 is formed on the first conductive pillars 121. The metal layer 1620 is in directly contact with the upper surfaces 121a of the first conductive pillars 121. The metal layer 1620 is such as cobalt or nickel. In the embodiment, the metal layer 1620 is substantially formed on the surface of the whole structure, covering the stacked structures 110, the striped conductive structures 130 and 130', and the contact area BLP. Moreover, the metal layer 1620 is in directly contact with the upper surfaces of the striped conductive structures 130 and 130'.

Figure 17:
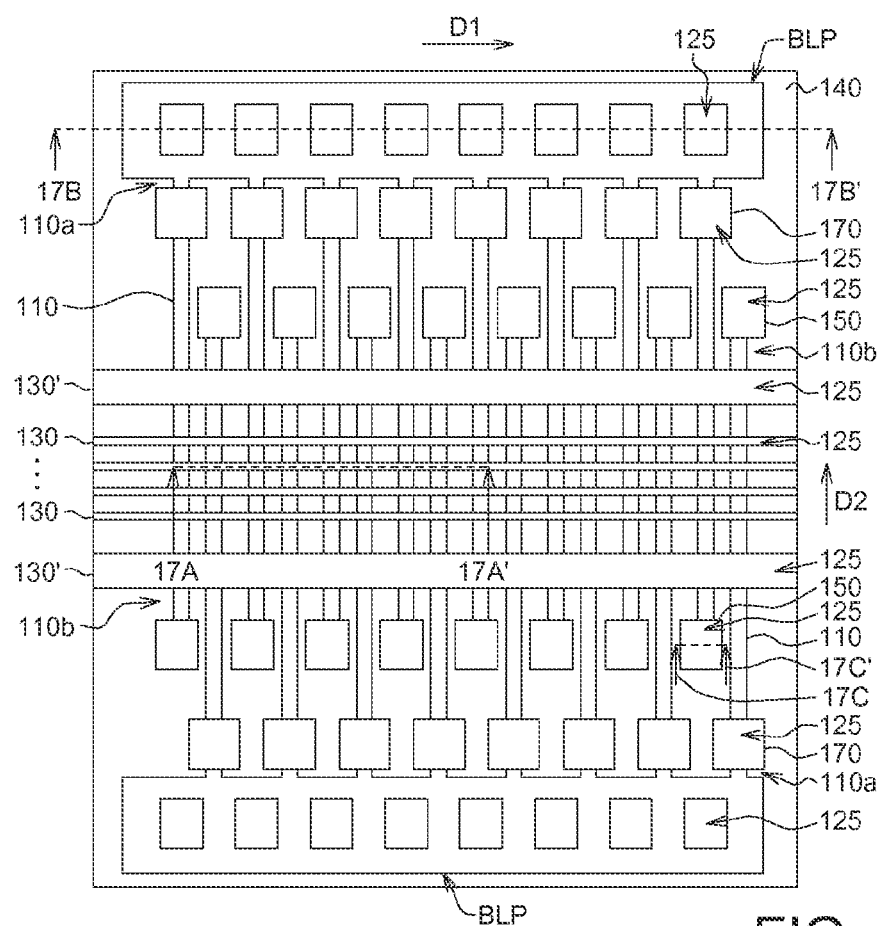
Figure 18A:
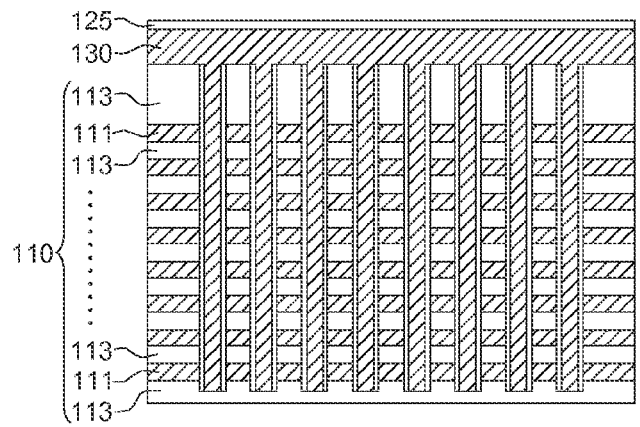
Figure 18B:
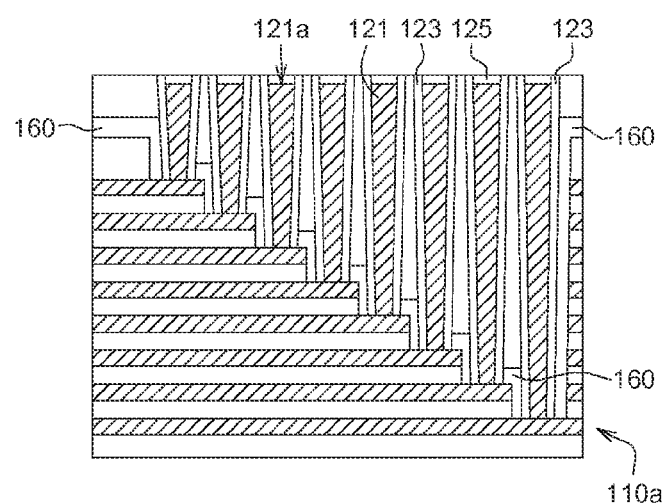
Figure 18C:
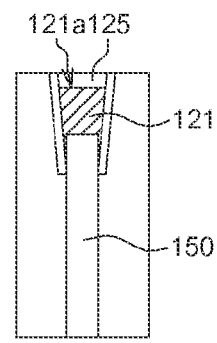

As shown in FIGS. 17-18C (FIG. 18A shows a cross-sectional view along the section line 17A-17A' in FIG. 17, FIG. 18B shows a cross-sectional view along the section line 17B-17B' in FIG. 17, FIG. 18C shows a cross-sectional view along the section line 17C-17C' in FIG. 17), the first conductive pillars 121 and the striped conductive structures 130 and 130' are such as made of silicon-containing materials. After a thermal treatment to the metal layer 1620, the metal silicide layer 125 is formed on the upper surfaces of the first conductive pillars 121 and the upper surfaces of the striped conductive structures 130 and 130'. The as-formed metal silicide layer 125 is such as cobalt silicide or nickel silicide.

The manufacturing method of forming the second conductive pillars includes such as the following steps.

Figure 19A:
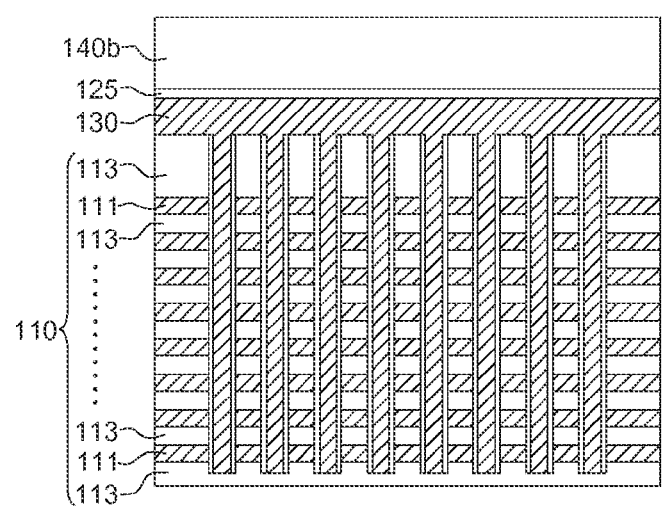
Figure 19B:
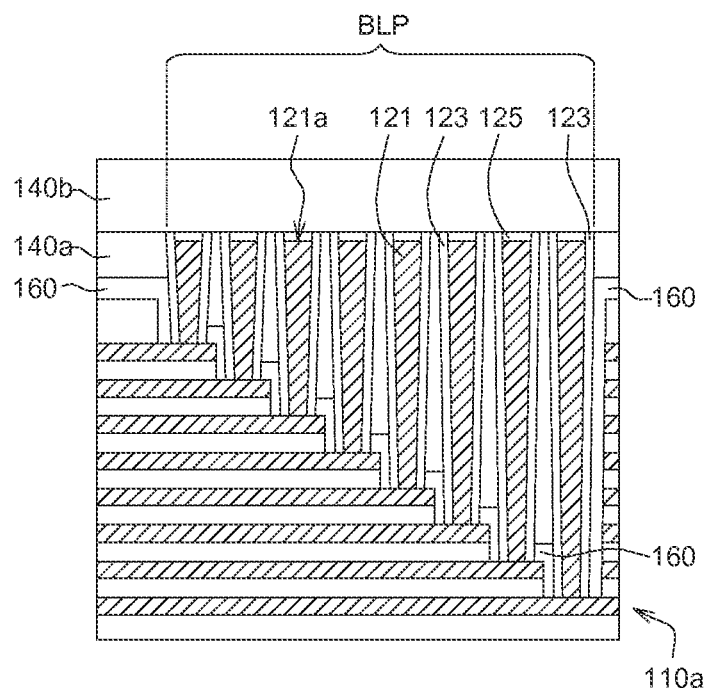
Figure 19C:
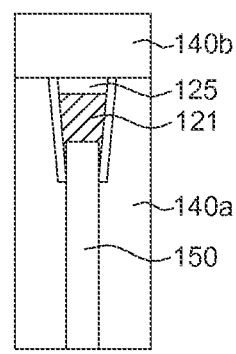

As shown in FIGS. 19A-19C (FIG. 19A shows a cross-sectional view along the section line 17A-17A' in FIG. 17, FIG. 19B shows a cross-sectional view along the section line 17B-17B' in FIG. 17, FIG. 19C shows a cross-sectional view along the section line 17C-17C' in FIG. 17), an insulating material layer 140b is formed on the surface of the whole structure. In other words, the insulating material layer 140b covers the stacked structures 110 and the contact area BLP. In the embodiment, the insulating material layer 140b covers all of the metal silicide layers 125. In the embodiment, the insulating material layer 140b comprises a metal oxide, and the insulating material layer 140b is such as an interlayer dielectric (ILD).

Figure 20A:
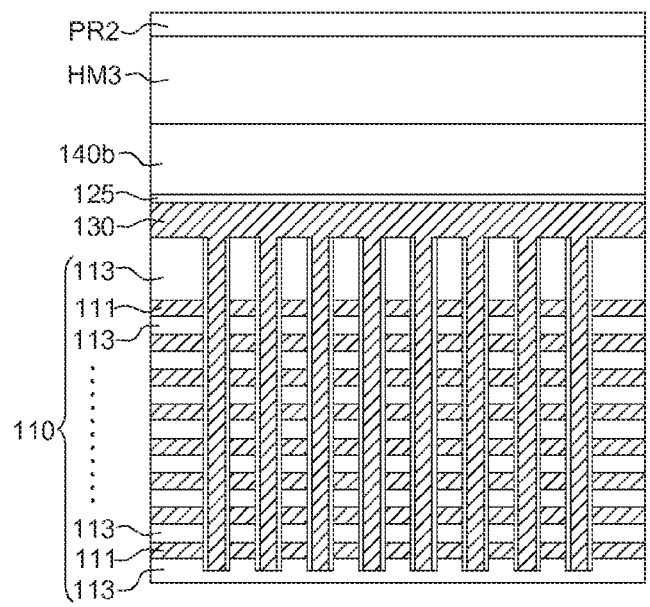
Figure 20B:
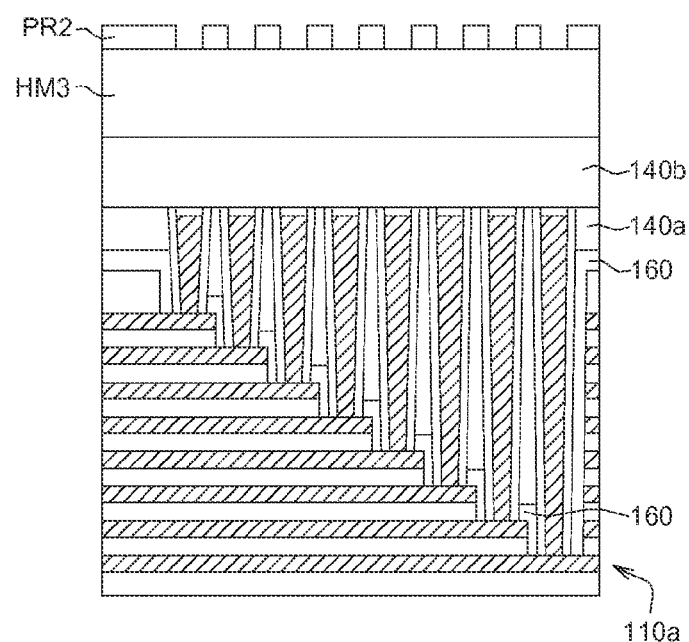

As shown in FIGS. 20A-20C (FIG. 20A shows a cross-sectional view along the section line 17A-17A' in FIG. 17, FIG. 20B shows a cross-sectional view along the section line 17B-17B' in FIG. 17, FIG. 20C shows a cross-sectional view along the section line 17C-17C' in FIG. 17), a hard mask HM3 is disposed on the insulating material layer 140b, and then a patterned photoresist PR2 is disposed on the hard mask HM3. In the embodiment, the pattern of the photoresist PR2 corresponds to the to-be-formed second conductive pillars 127.

Figure 21A:
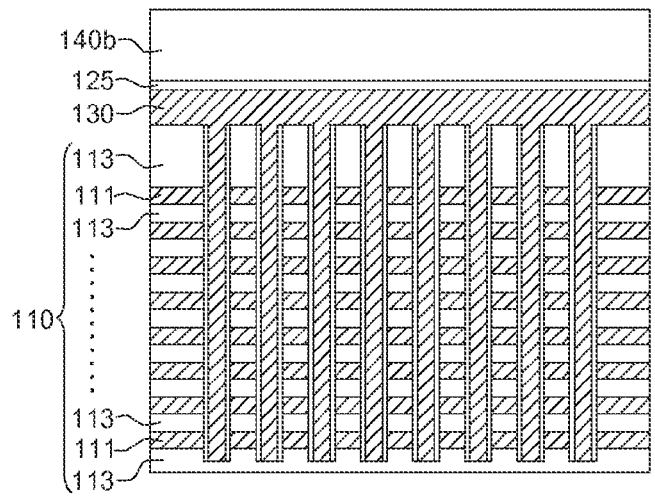
Figure 21B:
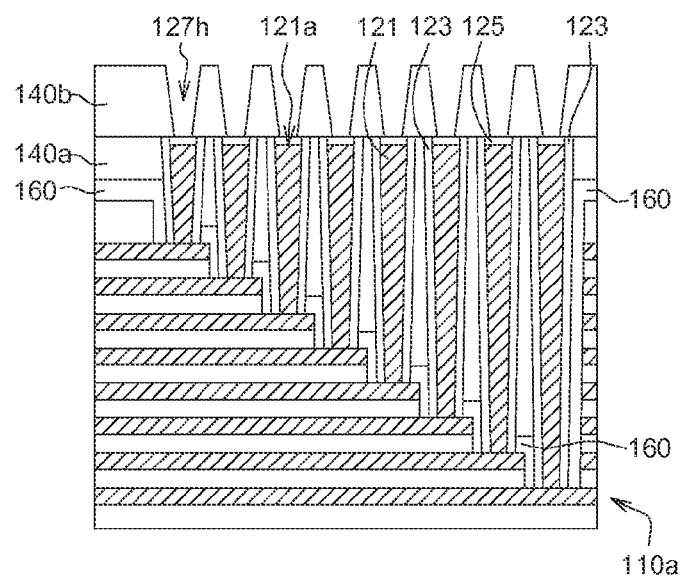
Figure 21C:
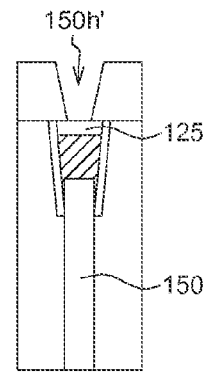

As shown in FIGS. 21A-21C (FIG. 21A shows a cross-sectional view along the section line 17A-17A' in FIG. 17, FIG. 21B shows a cross-sectional view along the section line 17B-17B' in FIG. 17, FIG. 21C shows a cross-sectional view along the section line 17C-17C' in FIG. 17), a plurality of holes 127h are formed in the insulating material layer 140b, and first conductive pillars 121 on the metal silicide layers 125 are exposed from the holes 127. In the embodiment, a plurality of holes 150h' are also formed in the insulating material layer 140b above the conductive blocks 150, and a plurality of holes are further formed in the insulating material layer 140b above the conductive blocks 170. The metal silicide layers 125 above the conductive blocks 150 and 170 are exposed. In the embodiment, the holes are formed by, such as a mask etching process, etching the insulating material layer 140b according to the patterned photoresist PR2.

Figure 22:
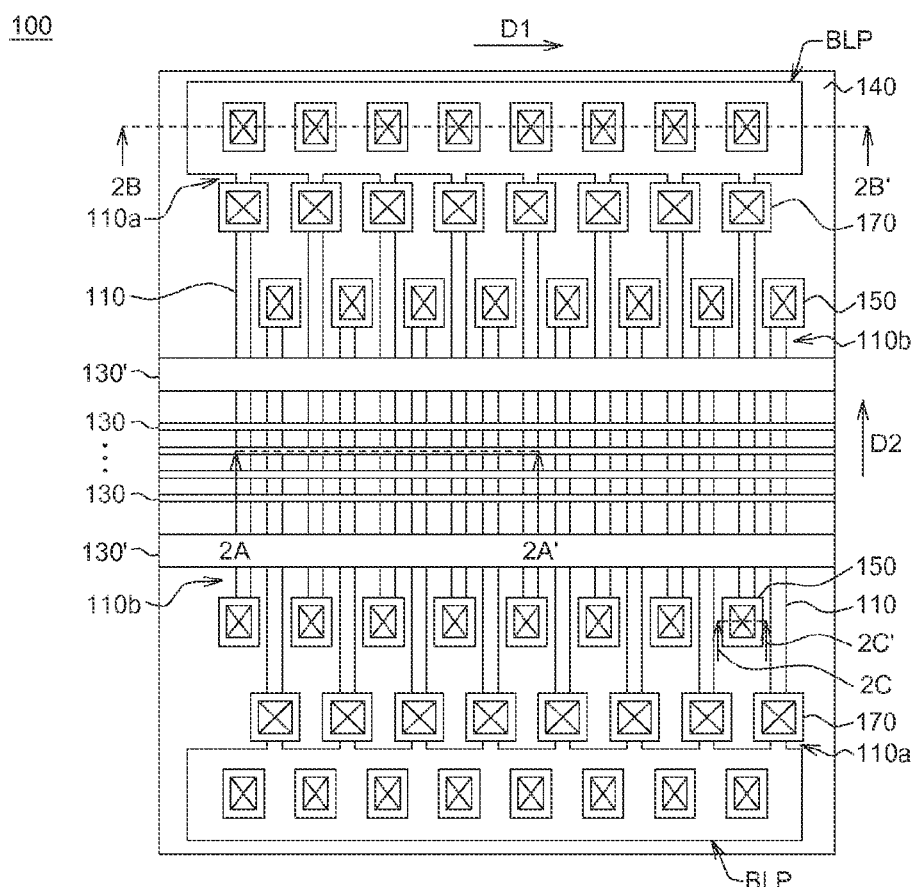
Figure 23A:
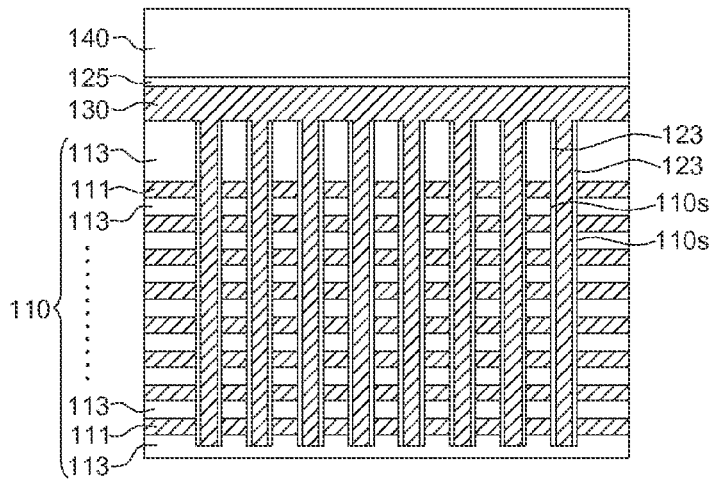
Figure 23B:
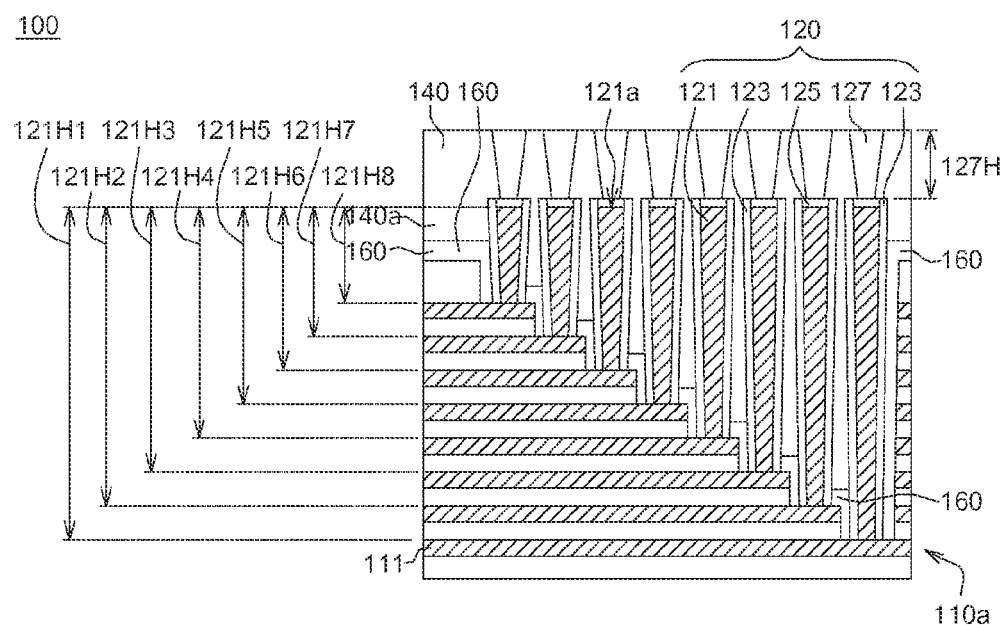
Figure 23C:
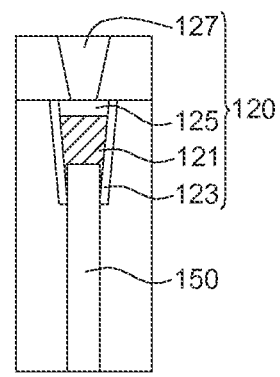

As shown in FIGS. 22-23C (FIG. 23A shows a cross-sectional view along the section line 22A-22A' in FIG. 22, FIG. 23B shows a cross-sectional view along the section line 22B-22B' in FIG. 22, FIG. 23C shows a cross-sectional view along the section line 22C-22C' in FIG. 22), a conductive material is filled in the holes 127h to form the second conductive pillars 127. In the embodiment, the second conductive pillars 127 are also formed in the holes above the conductive blocks 150 and 170. In the embodiment, the surfaces of the insulating material layer 140b and the second conductive pillars 127 are further planarized, such that the heights of the second conductive pillars 127 are the same. As such, the semiconductor structure 100 is formed.

As shown in FIGS. 22-23C, the insulating material layers 140a and 140b form an insulating structure 140. The insulating structure 140 is formed between the contact structures 120, and the contact structures 120 are separated from one another by the insulating structure 140. Besides, the striped conductive structures 130 and 130' are separated from on another by the insulating structure 140 (insulating material layer 140a).

In an embodiment, the semiconductor structure 100 is such as a 3D memory device, the contact structure 120 on the conductive blocks 150 are such as contact plugs for the source contacts, the contact structure 120 on the conductive blocks 170 are such as contact plugs for the string select lines, the contact structures 120 located on the contact area BLP are such as a bit line pad (BLP). The conductive strips 111 in different layers of the stacked structure 110 cab be accessed through the step-like contact structures 120 in the contact area BLP.

Conventionally, the manufacturing method of a 3D memory device comprises about the following steps. The oxide layer on the step-like structure is etched to form a plurality of contact holes, wherein the etching depths of the contact holes are determined by the heights of the tungsten plugs to be formed in the following process, and then tungsten metal is filled in the holes to form a plurality of tungsten plugs with different heights. However, when the etching depth is greater, it would be more difficult to compactly fill the tungsten in the contact holes. If the contact holes are not filled compactly, there might be voids formed in the tungsten plugs, as such, the tungsten plugs might malfunction. Further, when contact holes with great depths are formed, the grinding step in the following process will become difficult to perform, and therefore, the difficulty of the whole manufacturing process is largely increased. In contrast, according to the embodiments of the present disclosure, the contact structure is formed by a two-step process. That is to say, a contact plug is formed by repeating the process of etching and filling a conductive material twice. As such, the contact structures are highly compact, no voids would be formed within the contact structures, and the contact structures with different heights can be formed in one manufacturing process. And hence, the manufacturing process is simplified, and the processing time and cost is reduced.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor structure, comprising:
    a plurality of stacked structures, wherein each of the stacked structures comprises a plurality of conductive strips and a plurality of insulating strips, and the conductive strips and the insulating strips are interlaced; and
    a plurality of contact structures, wherein each of the contact structures is electrically connected to each of the stacked structures, and each of the contact structures comprises:
        a first conductive pillar;
        a dielectric material layer surrounding the lateral surface of the first conductive pillar;
        a metal silicide layer formed on an upper surface of the first conductive pillar; and
        a second conductive pillar formed on the metal silicide layer;
    wherein the upper surfaces of the first conductive pillars are coplanar.

2. The semiconductor structure according to claim 1, wherein the heights of the second conductive pillars are the same.

3. The semiconductor structure according to claim 1, wherein at least one of the heights of the first conductive pillars is different from the heights of the other first conductive pillars.

4. The semiconductor structure according to claim 1, wherein the material of the first conductive pillars is different from the material of the second conductive pillars.

5. The semiconductor structure according to claim 1, wherein each of the first conductive pillars of the contact structures is electrically connected to one of the conductive strips of each of the stacked structures.

6. The semiconductor structure according to claim 1, further comprising:
    a plurality of striped conductive structures formed on and between the stacked structures, wherein the striped conductive structures are extended in a direction perpendicular to a direction which the stacked structures are extended in.

7. The semiconductor structure according to claim 6, further comprising:
    an insulating structure formed between the striped conductive structures.

8. The semiconductor structure according to claim 1, further comprising:
    an insulating structure formed between the contact structures, wherein the contact structures are separated from one another by the insulating structure.

9. The semiconductor structure according to claim 1, further comprising:
    a plurality of conductive blocks electrically connected to the stacked structures.

10. The semiconductor structure according to claim 9, wherein the contact structures are further formed on the conductive blocks.

11. A manufacturing method of a semiconductor structure, comprising:
- forming a plurality of stacked structures, comprising forming a plurality of conductive strips and a plurality of insulating strips, and the conductive strips and the insulating strips are interlaced; and
- forming a plurality of contact structures, wherein each of the contact structures is electrically connected to each of the stacked structures, and forming each of the contact structure comprises:
  - forming a first conductive pillar;
  - forming a dielectric layer surrounding the lateral surface of the first conductive pillar;
  - forming a metal silicide layer on an upper surface of the first conductive pillar; and
  - forming a second conductive pillar on the metal silicide layer;
- wherein the heights of the second conductive pillar are the same.

12. The method of manufacturing the semiconductor structure according to claim 11, wherein the steps of forming the first conductive pillars and forming the dielectric layers comprise:
- forming an insulating material layer;
- forming a plurality of holes in the insulating material layer, wherein a portion of each of the stacked structures is exposed from the holes;
- forming the dielectric layers on the sidewalls of the hole; and
- filling a conductive material in the holes for forming the first conductive pillars.

13. The method of manufacturing the semiconductor structure according to claim 11, further comprising:
- forming a plurality of striped conductive structures on and between the stacked structures, wherein the striped conductive structures are extended in a direction perpendicular to a direction which the stacked structures are extended in.

14. The method of manufacturing the semiconductor structure according to claim 13, wherein the step of forming the striped conductive structures and the step of forming the first conductive pillars are performed simultaneously.

15. The method of manufacturing the semiconductor structure according to claim 11, further comprising:
- forming an insulating structure between the striped conductive structures.

16. The method of manufacturing the semiconductor structure according to claim 11, further comprising:
- forming an insulating structure between the contact structures, wherein the contact structures are separated from one another by the insulating structure.

17. The method of manufacturing the semiconductor structure according to claim 11, further comprising:
- forming a plurality of conductive blocks electrically connected to the stacked structures, wherein the contact structures are further formed on the conductive blocks.

18. A manufacturing method of a semiconductor structure, comprising:
- forming a plurality of stacked structures, comprising forming a plurality of conductive strips and a plurality of insulating strips, and the conductive strips and the insulating strips are interlaced;
- forming an insulating material layer covering the stacked structures;
- forming a plurality of holes in the insulating material layer, wherein a portion of each of the stacked structures is exposed from the holes;
- forming a plurality of dielectric material layers on the sidewalls of the holes, respectively;
- filling a conductive material in the holes for forming a plurality of first conductive pillars;
- forming a plurality of metal silicide layers on upper surfaces of the first conductive pillars; and
- forming a plurality of second conductive pillars on the metal silicide layers, wherein the heights of the second conductive pillars are the same.

19. The method of manufacturing the semiconductor structure according to claim 18, further comprising:
- forming a plurality of trenches in the insulating material layer, wherein the trenches are extended in a direction perpendicular to a direction which the stacked structures are extended in, and trenches and the holes are formed simultaneously;
- forming the dielectric material layers on the sidewalls of the trenches and between the stacked structures; and
- filling the conductive material in the trenches for forming a plurality of striped conductive structures.

20. The method of manufacturing the semiconductor structure according to claim 19, wherein the conductive material is filled in the trenches and in the holes simultaneously.

* * * * *